(12) United States Patent
Takeuchi

(10) Patent No.: US 7,609,745 B2
(45) Date of Patent: Oct. 27, 2009

(54) SEMICONDUCTOR LASER APPARATUS

(75) Inventor: Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/840,602

(22) Filed: Aug. 17, 2007

(65) Prior Publication Data

US 2008/0056320 A1    Mar. 6, 2008

(30) Foreign Application Priority Data

Sep. 1, 2006    (JP)    ............... 2006-237591

(51) Int. Cl.
*H01S 3/08* (2006.01)
(52) U.S. Cl. ................. 372/99; 372/43.01; 372/50.124; 372/81; 372/108
(58) Field of Classification Search ............ 372/50.124, 372/92, 99, 43.01, 81, 108
See application file for complete search history.

(56) References Cited

U.S. PATENT DOCUMENTS

| 2002/0176474 | A1* | 11/2002 | Huang et al. ............. 372/96 |
| 2005/0087753 | A1* | 4/2005 | D'Evelyn et al. ......... 257/98 |
| 2007/0003697 | A1* | 1/2007 | Carlin et al. ............. 427/248.1 |
| 2007/0131950 | A1 | 6/2007 | Takeuchi .................. 257/93 |

FOREIGN PATENT DOCUMENTS

JP    7-297476    11/1995

OTHER PUBLICATIONS

Carlin, J.-F. et al., "Lattice-matched AlInN/GaN Distributed Bragg Reflectors for Nitride Microcavities",http://www.ioffe.rssi.ru/PLMCN4/abstracts/W4_1.pdf, 4th International Conference on Physics of Light-matter Coupling in Nanostructures (St. Petersburg, Russia) Jun. 29-Jul. 3, 2004.
Carlin, J.-F. et al., "Crack-free Fully Epitaxial Nitride Microcavity Using Highly Reflective AlInN/GaN Bragg Mirrors", Appl. Phys. Letters, 86 (031107), 2005, pp. 031107-1 to 031107-3.

* cited by examiner

*Primary Examiner*—Minsun Harvey
*Assistant Examiner*—Yuanda Zhang
(74) *Attorney, Agent, or Firm*—Fitzpatrick, Cella, Harper & Scinto

(57) ABSTRACT

A novel semiconductor laser device is provided which can suppress internal optical absorption even when In is used as a material for a semiconductor multilayer mirror containing a nitride. The semiconductor laser device has two mirrors disposed to face each other, and an active layer disposed therebetween. At least one of the mirrors is a multilayer mirror having first nitride semiconductor layers containing Ga and second nitride semiconductor layers containing Al, which are alternately laminated to each other. The second nitride semiconductor layer contains In and includes a first region having a refractive index lower than that of the first nitride semiconductor layer, and a second region having a refractive index lower than that of the first nitride semiconductor layer and an In concentration lower than that of the first region. The second region is disposed closer to the active layer than the first region.

13 Claims, 13 Drawing Sheets

|  | | AlInN (43 nm) | AlN (15 nm) / AlInN (29 nm) |
|---|---|---|---|
| ABSORPTION (cm−1) | | 50 | 20 |
| REFLECTANCE (%) | 20 PAIRS | 92.73 | 96.47 |
|  | 30 PAIRS | 98.00 | 99.37 |
|  | 40 PAIRS | 99.14 | 99.70 |
|  | 60 PAIRS | 99.45 | 99.77 |

SEMICONDUCTOR LASER APPARATUS

BACKGROUND OF THE INVENTION

1. Field of the Invention

The present invention relates to semiconductor laser devices used, for example, for optical communication apparatuses and electrophotographic printers, and more particularly, relates to a semiconductor laser device having improved multilayer mirrors used as a resonator.

2. Description of the Related Art

A surface emitting laser is one type of semiconductor laser developed to obtain light in a direction perpendicular to a semiconductor substrate. A great number of surface emitting lasers may be integrally arranged to form a two-dimensional array. Hence, when a surface emitting laser array is used as an exposure light source of an electrophotographic printer, by parallel processing of a printing step using a multibeam system, an increase in printing speed can be realized.

A surface emitting laser currently practically used is an element which emits laser light in an infrared region. However, when the oscillation wavelength is shortened from the infrared region to a blue or an ultraviolet region, the beam diameter can be decreased and a higher resolution can be obtained. Hence, surface emitting lasers which can be practically used from a blue to an ultraviolet region have been requested. Effects obtained by combination between a higher resolution caused by shortening a wavelength and parallel processing caused by using a multibeam system are significant, and besides the application to printers, expansion of applications for various fields can also be expected.

The surface emitting laser has a cavity provided perpendicular to an in-plane direction of a substrate, and in order to realize a surface emitting laser continuously operable at room temperature, a mirror capable of ensuring a reflectance of 99% or more must be used.

As the mirror as described above, a multilayer mirror has been used in which two types of materials having different refractive indices and having, for example, an optical thickness corresponding to ¼ wavelength are alternately laminated to each other at least two times.

In a near-infrared surface emitting laser using a GaAs-based semiconductor, which has been practically used, a semiconductor multilayer mirror is used in which GaAs and AlAs layers having extremely high crystallinity are provided in combination as constituent layers. In addition, a semiconductor multilayer mirror is also used in which AlGaAs containing a small amount of Al and AlGaAs containing a large amount of Al are provided in combination as constituent layers.

In addition, a semiconductor multilayer mirror used in a GaN-based semiconductor laser capable of emitting light of a shorter wavelength than that of a GaAs-based semiconductor laser has been studied and disclosed, for example, in Japanese Patent Laid-Open No. 7-297476, 4th International Conference on Physics of Light-Matter Coupling in Nanostructures, W4-1, 2004, St. Petersburg, Russia, and Appl. Phys. 86, 031107 (2005).

In order to obtain a high reflectance by a semiconductor multilayer mirror, it is necessary to increase the difference in refractive index between a material forming a high refractive-index layer and a material forming a low refractive-index layer and, in addition, to increase the number of lamination pairs each containing the high refractive-index layer and the low refractive-index layer. When the semiconductor multilayer mirror is formed by epitaxial growth, in order to suppress the lattice strain, the difference in lattice constant between the materials is preferably small. The reason for this is that when the cumulative lattice strain amount is increased, concomitant with an increase in the number of pairs, cracking may occur.

As for GaAs and AlAs forming a multilayer mirror used in a GaAs-based semiconductor laser, as shown in FIG. 14, the difference in lattice constant is very small (approximately 0.14%), and the difference in refractive index is sufficiently large (approximately 15%). Hence, in the GaAs-based semiconductor laser, a semiconductor multilayer mirror having a high reflectance can be obtained.

On the other hand, as for a semiconductor multilayer mirror used in a GaN-based semiconductor laser, the reflectance is difficult to be improved.

FIG. 15 shows the relationship between the lattice constant and the refractive index of material compositions used for a semiconductor multilayer mirror of a GaN-based semiconductor laser. In order to increase the difference in refractive index, when GaN is used for a high refractive-index layer and AlGaN containing an increased amount of Al is used for a low refractive-index layer (in a direction shown by the arrow in the figure), the degree of lattice mismatch is increased. For example, in order to increase the difference in refractive index, when several tens of pairs of GaN and AlN are grown on a GaN substrate, a large tensile strain is generated in an AlN layer in the multilayer film, and as a result, cracking occurs in the miller. As described above, when AlN or AlGaN containing an increased amount of Al is used, since the number of pairs to be laminated cannot be increased, it becomes difficult to achieve a reflectance of 99% or more.

As one method to solve the above problem, it has been investigated that instead of AlN and/or AlGaN, AlInN that can be lattice-matched with GaN is used for a constituent layer of a semiconductor multilayer mirror.

In Japanese Patent Laid-Open No. 7-297476, a semiconductor multilayer mirror formed of pairs of GaN/AlInN has been disclosed. In addition, in 4th International Conference on Physics of Light-Matter Coupling in Nanostructures, W4-1, 2004, St. Petersburg, Russia, and Appl. Phys. 86, 031107 (2005), it has been disclosed that when 40 pairs of GaN (high refractive-index layer) and $Al_{0.83}In_{0.17}N$ (low refractive-index layer) having a lattice match with GaN are formed, a high reflectance of 99.4% is realized.

However, by research carried out by the inventor of the present invention, it was finally understood that when GaN is used for a high refractive-index layer and $Al_{0.83}In_{0.17}N$ is used for a low refractive-index layer, since light absorption in an element is high, further improvement must be performed.

SUMMARY OF THE INVENTION

Accordingly, the present invention provides a novel semiconductor laser device capable of suppressing internal light absorption even when In is used as a constituent material for a semiconductor multilayer mirror including a nitride compound.

In accordance with the present invention, there is provided a semiconductor laser device comprising two mirrors disposed to face each other in order to form a cavity, and an active layer disposed between the mirrors. In this semiconductor laser device, at least one of the mirrors is a multilayer mirror including at least one first nitride semiconductor layer containing Ga and at least one second nitride semiconductor layer containing Al, which are alternately laminated to each other. The second nitride semiconductor layer includes: a first region having a refractive index lower than that of the first nitride semiconductor layer and containing In; and, a second region having a refractive index lower than that of the first nitride semiconductor layer and having an In concentration lower than that of the first region. In the second nitride semiconductor layer, the second region is disposed at a position closer to the active layer than a position at which the first region is disposed. According to the present invention, there can be provided a semiconductor laser device capable of suppressing a loss caused by internal optical absorption even if In is used as a constituent material for a semiconductor laser device including a nitride compound.

Further features of the present invention will become apparent from the following description of exemplary embodiments with reference to the attached drawings.

DESCRIPTION OF THE EMBODIMENTS

First, the reasons the optical absorption inside an element is increased when a nitride semiconductor containing In is used will be described. As the nitride semiconductor containing In, for example, aluminum indium nitride (AlInN) may be mentioned. When a compound is represented, for example, by AlInN, the composition ratio thereof is not limited unless particularly stated otherwise.

When a plurality of pairs each composed of GaN and $Al_{0.83}In_{0.17}N$ are laminated to each other, a GaN film can be formed at a high temperature of approximately 1,000° C. However, an AlInN film must be formed at a lower temperature in the range of approximately 700 to 800° C. At a high temperature equivalent to that for forming a GaN film, In is actively desorbed from a growing surface, and as a result, In is hardly incorporated in AlInN.

That is, when an AlInN film is formed, as described above, the temperature must be set to a temperature lower than a high crystal growth temperature which is generally optimum for a nitride semiconductor, and as a result, the crystallinity is degraded, and the optical absorption is increased.

The present invention has been made based on the findings described above. Hereinafter, the present invention will be described in detail.

First Embodiment

Semiconductor Laser Device 1

Figure 1:
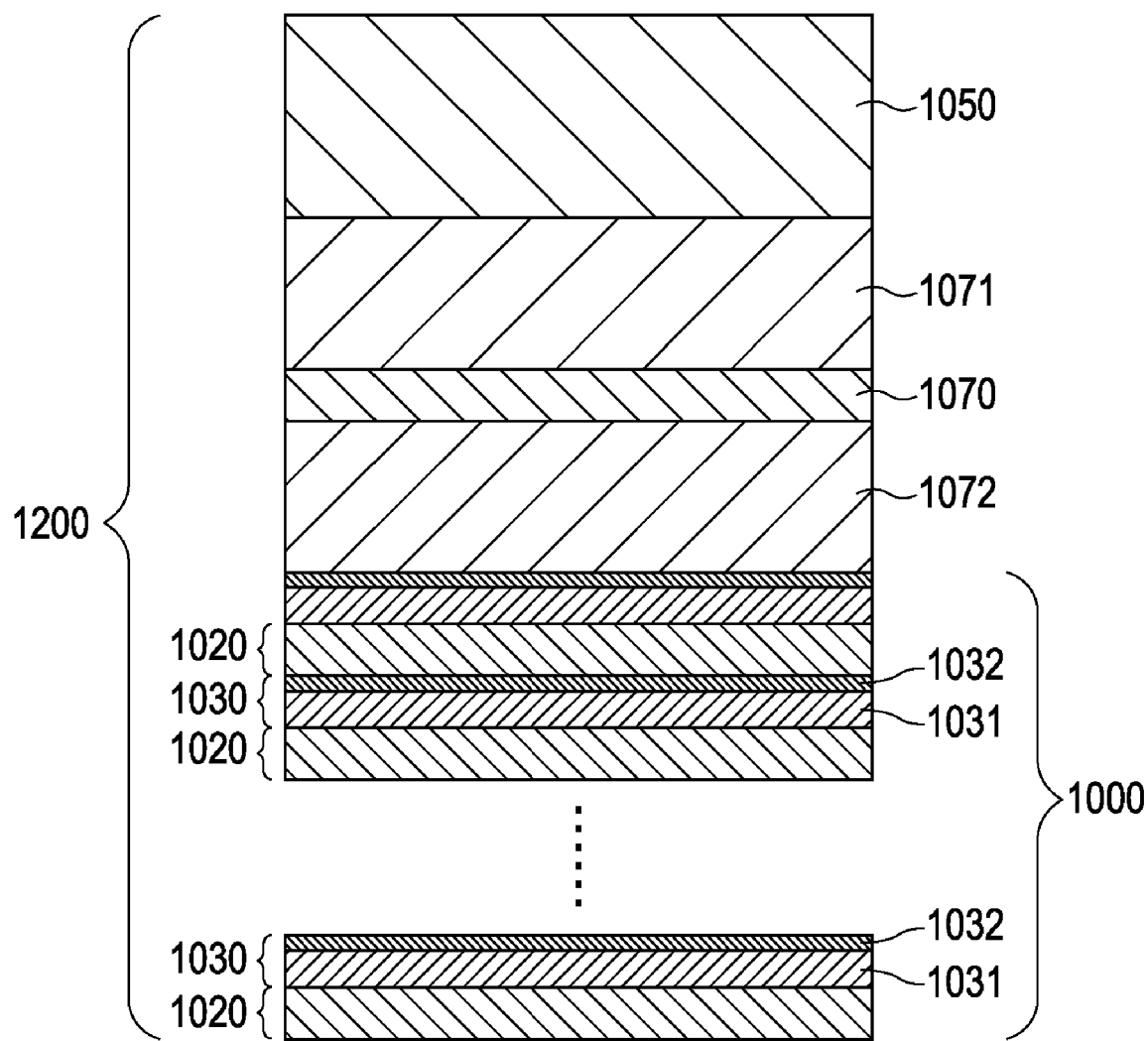
FIG. 1 is a view illustrating a semiconductor laser device according to a first embodiment.

A semiconductor laser device according to this embodiment of the present invention will be describe with reference to FIG. 1.

In FIG. 1, reference numeral 1200 indicates a resonator forming a semiconductor laser device, and two mirrors 1050 and 1000 are provided on the top and the bottom of an active layer 1070 with spacer layers 1071 and 1072 therebetween, respectively. A substrate not shown in the figure is provided at the side of one of the mirrors.

Hereinafter, the multilayer mirror 1000, which is the characteristic feature of the present invention, will be described. In the present invention, the multilayer mirror 1050 may have a similar structure to that of the multilayer mirror 1000.

This multilayer mirror 1000 is formed of first nitride semiconductor layers 1020 used as a high refractive-index layer and second nitride semiconductor layers 1030 used as a low refractive-index layer, which are alternately laminated to each other.

In this case, the second nitride semiconductor layer 1030 has a first region 1031 containing In and a second region 1032 having an In concentration (the case in which the In concentration is 0 is also included) lower than that contained in the first region 1031. In addition, the first region 1031 and the second region 1032 have a refractive index lower than that of the first nitride semiconductor layer 1020.

In the multilayer mirror 1000, the number of pairs each having the first nitride semiconductor layer 1020 and the second nitride semiconductor layer 1030 can be appropriately determined in the range of 2 to 500.

According to this embodiment of the present invention, the first region 1031 and the second region 1032 of the second nitride semiconductor layer 1030 are disposed as described below.

That is, as for the light intensity distribution (square of electric field distribution) in the multilayer mirror 1000 when laser is oscillated, the first region 1031 having a high optical absorption is disposed at a place at which the optical intensity is low (corresponding to the node of the electric field distribution). On the other hand, the second region 1032 having an optical absorption lower than that of the first region 1031 is disposed at a place at which the optical intensity is high (corresponding to the antinode of the electric field distribution). According to this embodiment of the present invention, the first region 1031 and the second region 1032 are disposed in consideration of the light intensity distribution, and hence the light absorption can be suppressed.

Next, the relationship of the active layer 1070 with the first region 1031 and the second region 1032 will be described with reference to FIG. 2.

In the multilayer mirror, the active layer 1070, the spacer layer 1072 used as a phase-matching layer, and pairs each containing the second nitride semiconductor layer 1030 as a low refractive-index layer and the first nitride semiconductor layer 1020 as a high refractive-index layer, are laminated to each other in that order. In part (a) of FIG. 2, the structure described above is shown, and the vertical axis indicates the refractive indexes of materials used for the layers described above. In this case, for the spacer layer 1072, a material having a bandgap wider than that of the active layer 1070 is used so that carriers can be efficiently injected therein. For example, the same material as that for the first nitride semiconductor layer 1020 can be used.

As described above, when the high refractive-index layers and the low refractive-index layers are alternately laminated to each other, the boundary obtained when light generated in the active layer travels from the high refractive-index layer to the low refractive-index layer corresponds to the antinode (open end) of the electric field distribution. On the other hand, the boundary formed when light travels from the low refractive-index layer to the high refractive-index layer corresponds to the node (fixed end) of the electric field distribution. Hence, the light intensity distribution obtained by multiplying the electric field distribution by itself has a waveform as shown in part (b) of FIG. 2.

As described above, in this embodiment of the present invention, the two regions are disposed in consideration of the light intensity distribution. Accordingly, as shown in part (c) of FIG. 2, in the second nitride semiconductor layer 1030, the first region 1031 having a high optical absorption is disposed at a place farther from the active layer 1070 than that at which the second region 1032 is disposed. On the other hand, the second region 1032 having a low optical absorption is disposed at a place closer to the active layer 1070 than that at which the first region 1031 is disposed.

Figure 2:
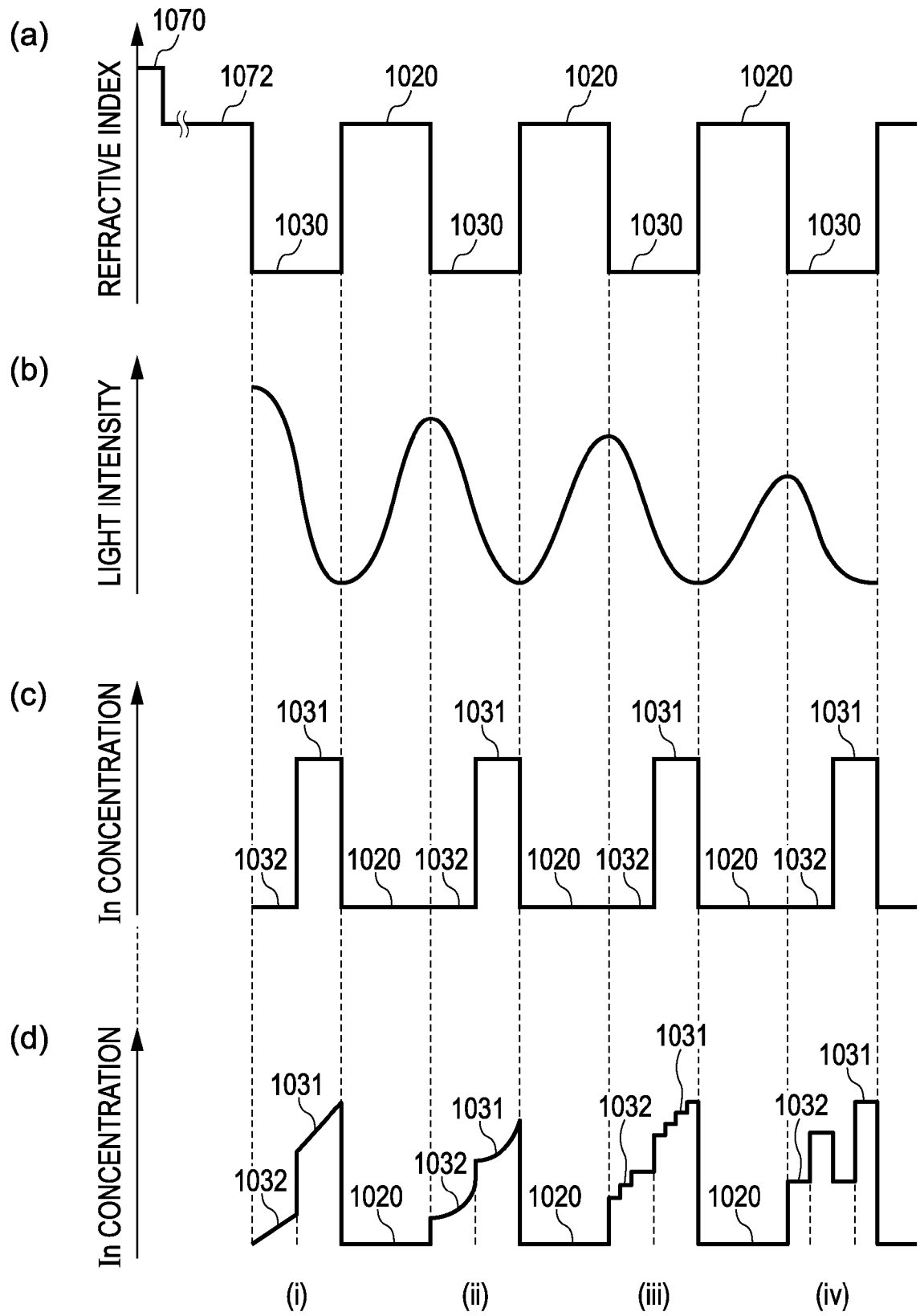
FIG. 2 is a view illustrating the relationship between the light intensity and the In concentration.

In the part (c) of FIG. 2, the case is shown in which the optical thickness of the first region 1031 and that of the second region 1032 are set to be equal to each other. That is, when the first nitride semiconductor layers and the second nitride semiconductor layers, each having an optical thickness of ¼ wavelength, are alternately laminated to each other, the first region 1031 and the second region 1032 each have an optical thickness of ⅛ wavelength. However, in this case, as long as the total thickness of the first region and the second region is an optical thickness of ¼ wavelength, each thickness thereof may be appropriately determined to be 2 nm or more.

In order to obtain an effective decrease in light absorption, the second region preferably has an optical thickness of 1/16 wavelength or more. In addition, in order to obtain an effective decrease in cumulative strain, the second region more preferably has an optical thickness of 3/16 wavelength or less.

In addition, the In concentration of the first region 1031 or that of the second region 1032 may be formed to have a concentration gradient in the lamination direction of the multilayer mirror 1000. For example, as shown in part (d) of FIG. 2, the change in concentration may have a linear, a curved, or a stepwise shape (see (i) to (iii)). In addition, at least one region other than the first region 1031 and the second region 1032 may also be provided (see (iv) in the part (d) of FIG. 2).

Furthermore, in the concrete examples described above, when the second nitride semiconductor layer is equally divided into two portions based on the optical thickness, it can also be expressed that the In concentration of the portion farther from the active layer is high as compared to that of the portion closer to the active layer. For example, when the high refractive-index layers and the low refractive-index layers, each having an optical thickness of ¼ wavelength, are laminated to each other, and when the low refractive-index layer is equally divided based on the optical thickness, two portions each having an optical thickness of ⅛ wavelength are formed. Of these two portions thus formed, when the In concentration of the portion apart (farther) from the active layer is higher than that of the portion close to the active layer, the light absorption can be suppressed.

In order to enable the multilayer mirror to function, the first nitride semiconductor layers and the second nitride semiconductor layers, functioning as the high refractive-index layers and the low refractive-index layers, respectively, and each having an optical thickness of m/4 wavelength (m: odd integer), may be alternately laminated to each other.

The first nitride semiconductor layer 1020 of this embodiment can be formed from a material having a relatively large refractive index, such as GaN, AlGaN, or AlGaInN. For example, when the wavelength of beams to be emitted is set to 400 nm, for the first nitride semiconductor layer 1020, GaN can be selected so as not to cause interband absorption.

In addition, according to this embodiment of the present invention, the second nitride semiconductor layer 1030 is formed of at least two regions. The first region 1031 is formed from a material containing In, such as AlInN or AlGaInN. On the other hand, the second region 1032 is formed from a material having an In concentration lower than that of the first region 1031.

As the material forming the second region, in view of suppression of internal optical absorption, AlN or AlGaN containing no In is preferable. In addition, since a binary material is easily formed, AlN is more preferable. However, when the In concentration of the second region is lower than that of the first region, AlInN or AlGaInN may also be used as the material forming the second region.

In order to suppress the internal optical absorption, when a material containing a small amount of In is selected for the second region 1032, crystalline defects caused by a tensile strain may occur with high probability. Hence, for the first region 1031, a material is preferably selected so that a compressive strain is generated therein.

In particular, when the amounts of the two types of strains are designed to counteract each other, the cumulative strain amount in the second nitride semiconductor layer 1030 can be significantly decreased. When the number of pairs laminated to form the multilayer mirror is very great, an increase in cumulative strain amount can be effectively suppressed.

For example, when GaN is selected for the first nitride semiconductor layer, $Al_{0.73}In_{0.27}N$ having a thickness of 29 nm is used for the first region 1031 forming the second nitride semiconductor layer 1030, and AlN having a thickness of 15 nm is used for the second region 1032, the cumulative strain amount can be significantly decreased. As described above, in consideration of the relationship represented by (cumulative strain)=(strain amount)×(film thickness), materials may be appropriately selected.

In addition, the In concentration of the first region and that of the second region can be appropriately selected from various points of view.

The case will be considered in which GaN is used for the first nitride semiconductor layer (high refractive-index layer), AlInN is used for the second nitride semiconductor layer (low refractive-index layer), and the thickness of the first region of the second nitride semiconductor layer is two times that of the second region. In this case, the In concentration of the second region can be selected from the range of 0 to 0.17, and the In concentration of the first region can be selected from the range of 0.17 to 0.4. In addition, in order to further suppress the optical absorption, the In concentration of the second region is preferably set in the range of 0 to 0.05. In addition, in order to further decrease the cumulative strain, it is more preferable that the In concentration of the second region be in the range of 0 to 0.05 and that the In concentration of the first region be in the range of 0.24 to 0.3.

Next, the case will be considered in which $Al_{0.1}Ga_{0.9}N$ is used for the first nitride semiconductor layer (high refractive-index layer), AlInN is used for the second nitride semiconductor layer (low refractive-index layer), and the thickness of the first region of the second nitride semiconductor layer is two times that of the second region. In this case, the In concentration of the second region can be selected from the range of 0 to 0.15, and the In concentration of the first region can be selected from the range of 0.15 to 0.36. In addition, in order to further suppress the light absorption, the In concentration of the second region is preferably set in the range of 0 to 0.05. Also, in order to further decrease the cumulative strain, it is more preferable that the In concentration of the second region be in the range of 0 to 0.05 and that the In concentration of the first region be in the range of 0.21 to 0.27.

Furthermore, the case will be considered in which $In_{0.1}Ga_{0.9}N$ is used for the first nitride semiconductor layer (high refractive-index layer), AlInN is used for the second nitride semiconductor layer (low refractive-index layer), and the thickness of the first region of the second nitride semiconductor layer is two times that of the second region. In this case, the In concentration of the second region can be selected from the range of 0 to 0.25, and the In concentration of the first region can be selected from the range of 0.25 to 0.46. In addition, in order to further suppress the light absorption, the In concentration of the second region is preferably set in the range of 0 to 0.05. Furthermore, in order to further decrease the cumulative strain, it is more preferable that the In concentration of the second region be in the range of 0 to 0.05 and that the In concentration of the first region be in the range of 0.31 to 0.37.

In the cases described above, in order to increase the difference in refractive index as large as possible, for the second nitride semiconductor layer, a ternary compound, that is, AlInN, is used. In addition, when it is intended to form a low resistance multilayer mirror for easy current injection, AlGaInN, which is a quaternary compound, having a small bandgap may also be used.

As a material forming the active layer 1070, for example, InGaN or AlGaN may be mentioned. In addition, a quantum well layer including the material mentioned above is also preferably formed.

The spacer layers 1071 and 1072 are layers each used for adjusting the phase in order to obtain a desired resonant wavelength, and they are formed, for example, from GaN or AlGaN. In addition, the spacer layer may be called a cladding layer in some cases.

In this embodiment according to the present invention, as a support substrate for the multilayer mirror 1000, for example, a GaN substrate, a sapphire substrate, or an AlGaN substrate may be used.

In addition, between this support substrate and the multilayer mirror 1000, GaN, AlGaN, AlN or the like may be provided as a buffer layer.

Figure 3A:
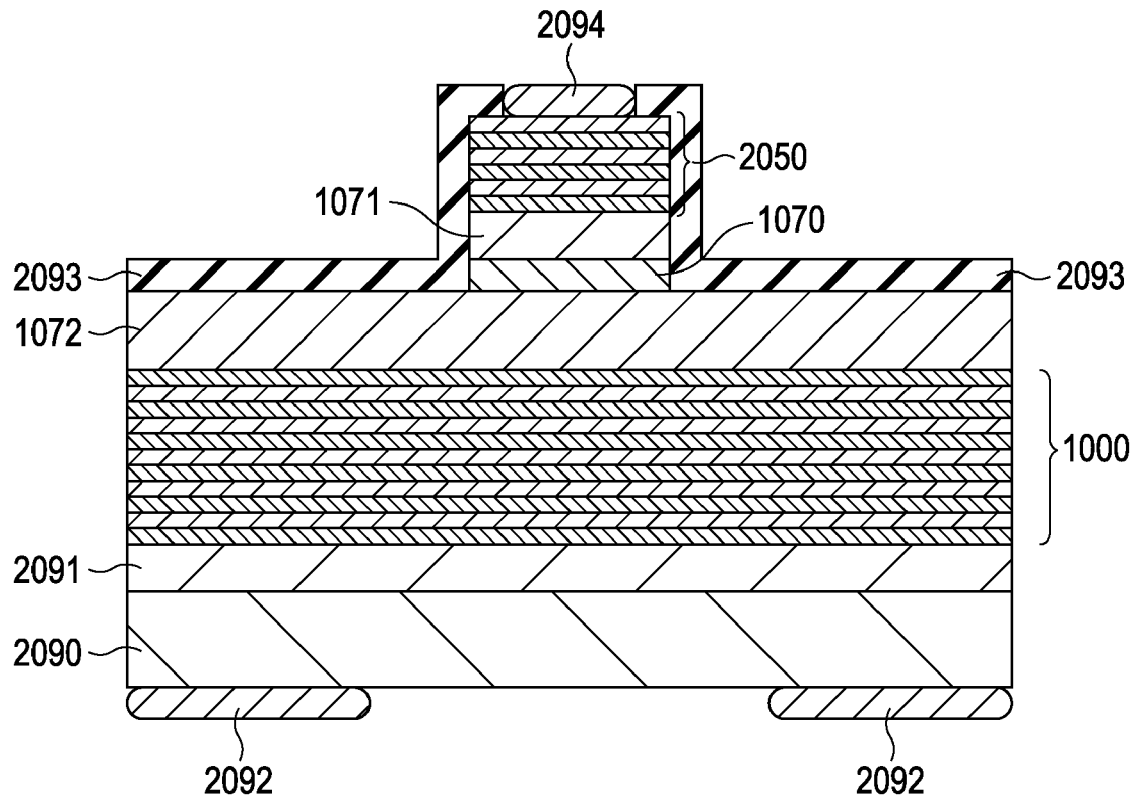
FIG. 3A is a cross-sectional view showing one structural example of a surface emitting laser.
Figure 3B:
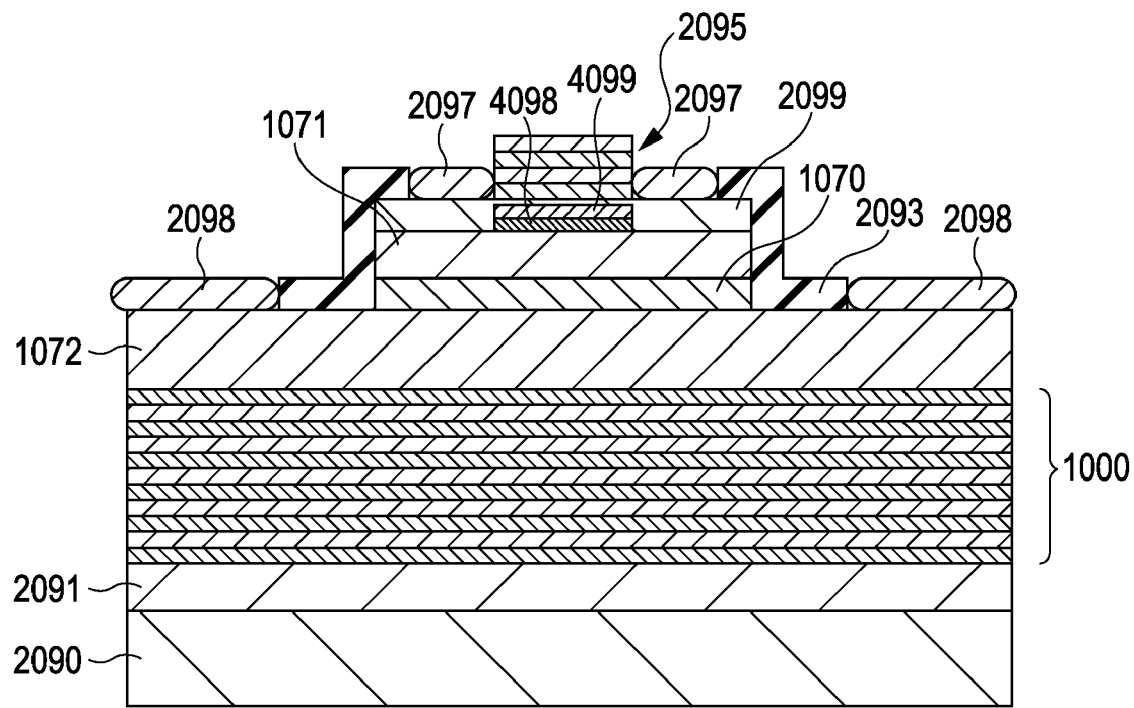
FIG. 3B is a cross-sectional view showing another structural example of a surface emitting laser.

In the semiconductor laser device according to this embodiment, laser beams oscillating by optical pumping and by current injection are both included. FIGS. 3A and 3B are cross-sectional views each showing a structural example of a current injection-type surface emitting laser.

In FIG. 3A, reference numerals 1000 and 2050 indicate the multilayer mirrors described above, and for example, a p-type distributed Bragg reflector (DBR) 2050 and an n-type DBR 1000 are provided at the upper portion and the lower portion of the active layer 1070, respectively. The multilayer mirrors provided at the upper portion and the lower portion may have the same layer structure. In this case, the high refractive-index layers and the low refractive-index layers are symmetrically disposed with respect to the active layer. In addition, one of the multilayer mirrors, for example, the mirror at the upper portion may be formed to be a dielectric multilayer mirror (a laminate of silicon oxide such as $SiO_2$ and titanium oxide such as $TiO_2$, a laminate of silicon oxide such as $SiO_2$ and zirconium oxide such as $ZrO_2$, or the like). Furthermore, a two-dimensional refractive index periodic structure, which is a so-called photonic crystal, may also be used. The structure described above can be obtained, for example, by periodically forming fine holes in places of triangular lattice points and/or tetragonal lattice points arranged in an in-plane direction.

The active layer 1070 may be formed to have a quantum well structure using GaInN N or the like. Reference numerals 1071 and 1072 indicate spacers which are formed using AlGaN or GaN having a low resistance. Reference numeral 2090 indicates a GaN substrate, and reference numeral 2091 indicates a GaN buffer layer (epitaxial layer). Reference numeral 2092 indicates an n-side electrode (negative electrode) and is formed, for example, of Ti/Al. Reference numeral 2093 indicates an insulating layer composed of $SiO_2$ or SiN, and reference numeral 2094 indicates a p-side electrode (positive electrode) composed of Ni/Au or Pd/Au. As shown by way of example, when the electrode is formed of two layers, Ni, Pd, or Ti is disposed at the semiconductor layer side.

In the current injection type surface emitting laser thus formed, when the reflectance of the DBR at the upper side of the active layer is set to be higher than that of the DBR at the lower side, light can be emitted from the substrate side.

In addition, FIG. 3B shows another structural example. Reference numeral 1070 indicates an active layer, reference numeral 1071 indicates a p-type spacer layer, reference numeral 1072 indicates an n-type spacer layer, and the materials therefor are the same as those in the case shown in FIG. 3A. Reference numeral 2090 indicates a GaN substrate, and reference numeral 2091 indicates a GaN buffer layer. In addition, between the p-type spacer layer 1071 and a dielectric multilayer mirror 2095, an n-type layer 2099 having a tunnel junction region is provided. In this n-type layer 2099, a $p^+$ region 4098 and an $n^+$ region 4099 are provided.

The amounts of doped carriers in these two regions are each approximately $10^{19}$ to $10^{20}/cm^3$. Hence, the injection current into the active layer 1070 can be confined.

In addition, reference numeral 1000 indicates the multilayer mirror described in this embodiment, and for example, an undoped DBR is used. Reference numeral 2095 indicates a dielectric multilayer mirror (formed, for example, of a plurality of pairs of $SiO_2$ and $ZrO_2$ laminated to each other). Reference numeral 2093 indicates an insulating layer similar to that shown in FIG. 3A.

Reference numeral 2098 indicates a first n-side ring electrode (negative electrode), and reference numeral 2097 indicates a second n-side ring electrode (positive electrode). The electrode materials described in FIG. 3A can be applied thereto.

In addition, the structures of the surface emitting laser described with reference to FIGS. 3A and 3B are shown by way of example, and the multilayer mirror of this embodiment can also be applied to the structure described, for example, in the above Japanese Patent Laid-Open No. 7-297476.

The embodiment according to the present invention is not only applied to semiconductor laser devices such as a surface emitting laser but can also be applied to other optical elements containing a III group nitride semiconductor multilayer mirror.

Second Embodiment

Semiconductor Laser Device 2

In the above first embodiment of the present invention, the case is described in which the material forming the low refractive-index layer contains In. In this embodiment of the present invention, the case will be described in which a material forming the high refractive-index layer contains In.

Also when the high refractive-index layer is formed from a material containing In, the layer is not formed only by a region containing In and is formed from at least two regions. Accordingly, while advantages caused by the use of In are being obtained, the internal light absorption can be suppressed.

Figure 4:
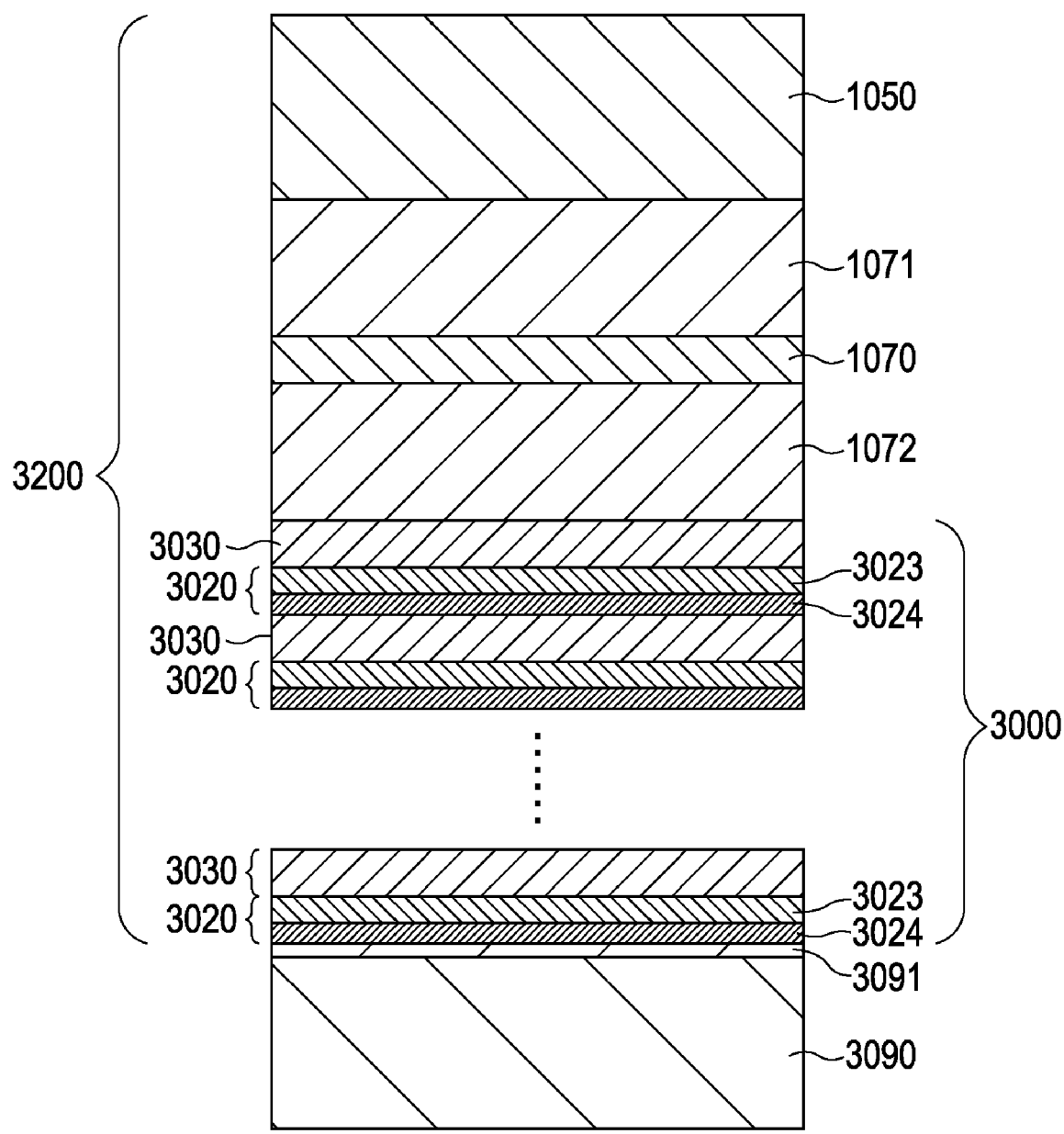
FIG. 4 is a view illustrating a semiconductor laser device according to a second embodiment.

The semiconductor laser device according to this embodiment will be described with reference to FIG. 4. On a GaN substrate 3090, two mirrors forming a resonator 3200 of this semiconductor laser device are provided. At least one of the above two mirrors is a multilayer mirror 3000 in which first nitride semiconductor layers 3020 used as a high refractive-index layer and second nitride semiconductor layers 3030 used as a low refractive-index layer are alternately laminated to each other. Reference numeral 3091 indicates a buffer layer formed from GaN or the like to be used whenever necessary. In addition, in FIG. 4, components having the same reference numerals as those shown in FIG. 1 are similar to those described in the above first embodiment, and description thereof is omitted.

This first nitride semiconductor layer 3020 has a first region containing In and a second region containing In at a concentration lower than that of the first region. In addition, the first region and the second region have a refractive index higher than that of the second nitride semiconductor layer 3030.

Furthermore, the first region is located at a position closer to the active layer than that of the second region. That is, in the first embodiment, although the first region having a high light absorption is disposed at a position apart from the active layer, in the second embodiment, the first region having a high light absorption is disposed at a position close to the active layer; hence, this is the difference between the two embodiments. This can be easily understood with reference to the relationship between the refractive index and the light intensity distribution shown in the parts (a) and (b) of FIG. 2. In addition, the second embodiment according to the present invention will be described in detail with reference to example 2 described below.

Hereinafter, the present invention will be described in detail with reference to examples.

EXAMPLES

Example 1

Multilayer Mirror Composed of (AlN/AlInN)/GaN

Figure 5:
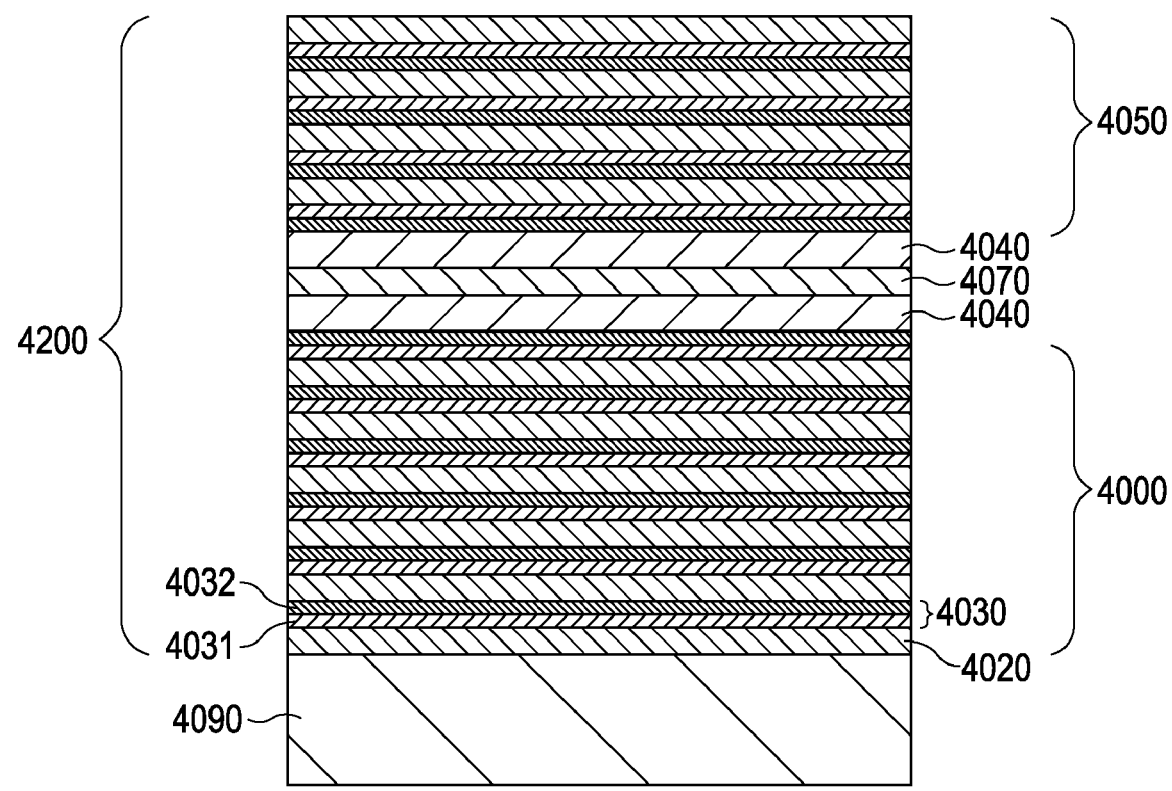
FIG. 5 is a view illustrating a semiconductor laser device according to example 1.

FIG. 5 is a schematic cross-sectional view showing a surface emitting laser according to a first mode of the present invention.

A cavity 4200 of the laser according to this example is composed of a quantum well active layer 4070, spacer layers 4040 provided on the top and the bottom thereof, and multilayer mirrors 4000 and 4050 provided on the respective spacer layers.

The quantum well active layer 4070 used in this example includes, for example, four InGaN wells. In this case, the peak wavelength of the emission light wavelength is 400 nm.

In addition, GaN is used for the spacer layers 4040, and the thicknesses thereof are adjusted so as to form a cavity having a two-wavelength optical thickness. Whenever necessary, the emission light wavelength, the number of wells, and/or the spacer layers can be adjusted.

The nitride multilayer mirror is formed of low refractive-index layers 4030 and high refractive-index layers 4020, which are alternately laminated to each other on a substrate 4090. The low refractive-index layer 4030 is formed in combination of two regions of AlN 4032 and $Al_{0.73}In_{0.27}N$ 4031, and the high refractive-index layer 4020 is formed of GaN. The optical thickness of the low refractive-index layers (4030) and that of the high refractive-index layer (4020) are each set to ¼ wavelength. In addition, the thickness ratio of the AlN layer to the $Al_{0.73}In_{0.27}N$ layer is set to 1 to 2.

Next, the structure of this nitride multilayer mirror will be described. In part (1) of FIG. 6, an enlarged view of a resonator structure is shown containing the $(AlN/Al_{0.73}In_{0.27}N)$/GaN multilayer mirror 4000 and the InGaN quantum well active layer 4070 shown in FIG. 5.

Figure 6:
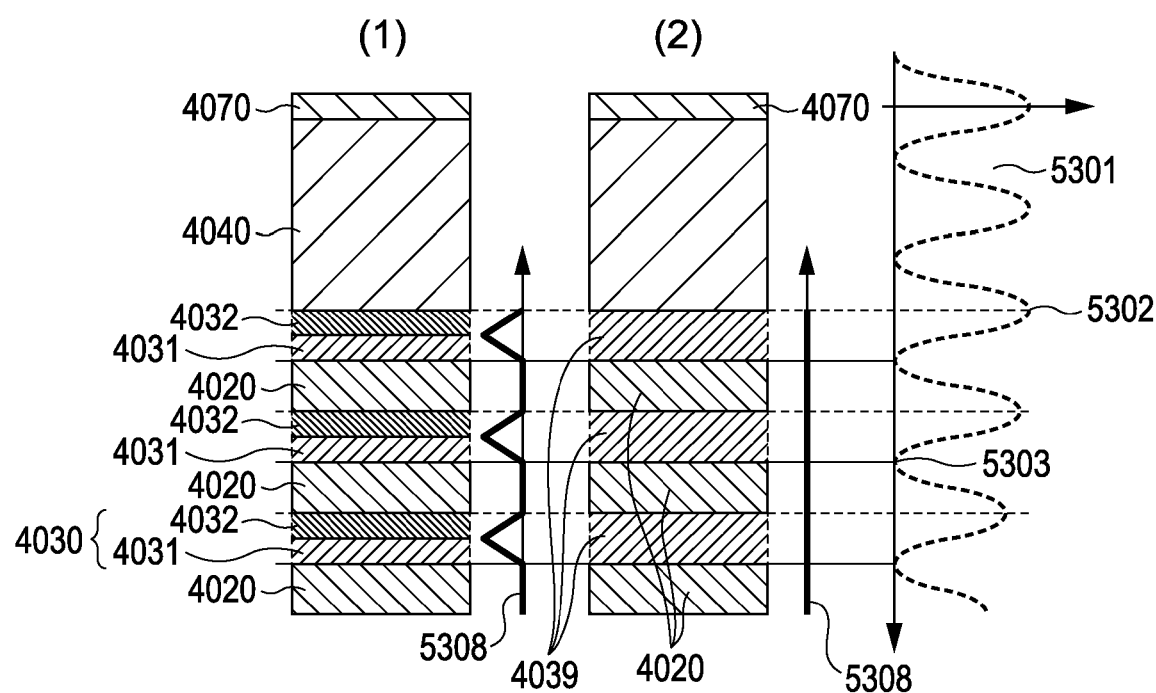
FIG. 6 is a view showing a resonator structure, internal light intensity distribution, and cumulative strain amount.

Part (2) of FIG. 6 shows the case, for the comparison purpose, in which GaN is used for the high refractive-index layer 4020 and only $Al_{0.83}In_{0.17}N$ is used for the low refractive-index layer 4039 as in the past. In this figure, in order to facilitate the understanding of the figure, a lower multilayer mirror is shown which is formed by laminating only the active layer, the spacer layer, and three pairs of the high and the low refractive-index layers.

In addition, at the right side of the parts (1) and (2) of FIG. 6, the internal light intensity distribution 5301 corresponding to the constituent layers is shown. As shown in the part (1) of FIG. 6, the AlN layer 4032 containing no In of the low refractive-index layer is disposed at the antinode side (5302) of the light intensity distribution, and the $Al_{0.73}In_{0.27}N$ layer 4031 containing In is disposed at the node side (5303).

That is, in the low refractive-index layer, the AlN layer 4032 containing no In is disposed at the side close to the active layer, and the $Al_{0.73}In_{0.27}N$ layer 4031 containing In is disposed at the side apart from the active layer.

In addition, as shown in FIG. 5, also in the upper nitride semiconductor multilayer mirror, the individual layers are disposed in a manner similar to that described above. In this case, the layer structure of the upper multilayer mirror and that of the lower multilayer mirror form a mirror symmetric structure with respect to the active layer. However, in the upper and the lower multilayer mirrors, the numbers of pairs forming the individual mirrors may be different from each other.

In the structure shown in the part (2) of FIG. 6, the low refractive-index layer is formed of the $Al_{0.83}In_{0.17}N$ layer 4039, and in 4th International Conference on Physics of Light-Matter Coupling in Nanostructures, W4-1, 2004, St. Petersburg, Russia, and Appl. Phys. 86, 031107 (2005), it is reported that the light absorption in this case is 50 $cm^{-1}$.

However, when compared to the value of a GaAs-based material (10 to 20 $cm^{-1}$), this value, 50 $cm^{-1}$, is two times or more. When a GaN-based material and a GaAs-based material are compared to each other, the injected carrier density of a GaN-based material necessary to obtain the same gain as that of a GaAs-based material is several times or more the injected carrier density thereof. Hence, unless the internal optical absorption in the mirror is decreased by improvement, because of influence of heat generation, it is difficult to perform continuous operation at room temperature.

Figures 7, 8:
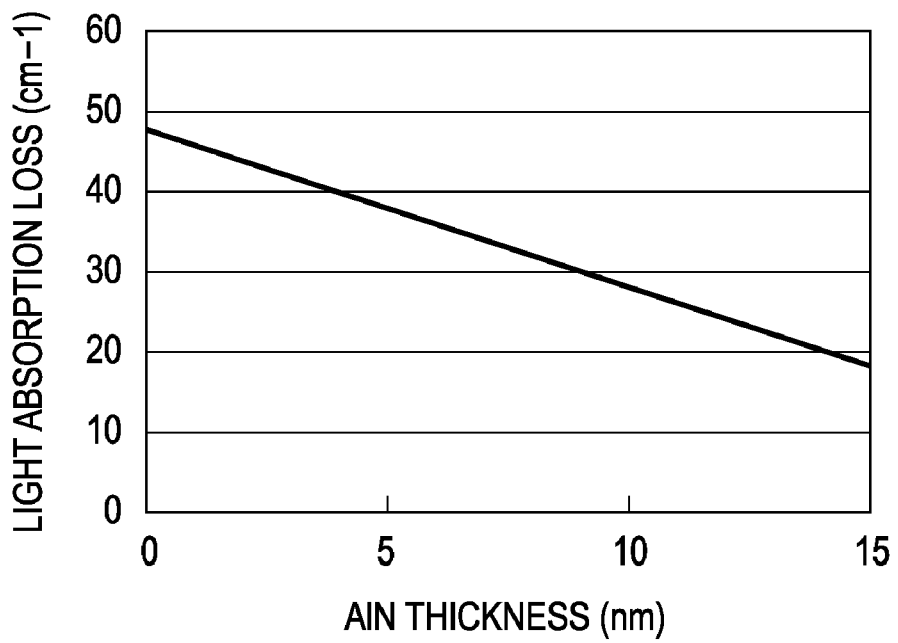
FIG. 7 is a graph showing the relationship between the thickness of an aluminum nitride layer and a light absorption loss.
FIG. 8 is a view showing the relationship between the number of lamination pairs and the reflectance.

Next, the result of AlN layer thickness dependence of optical absorption is shown in FIG. 7. When the thickness of the AlN layer is 0 nm, and the optical thickness of the $Al_{0.83}In_{0.17}N$ layer is ¼ wavelength (43 nm), that is, in the case shown in the part (2) of FIG. 6, the optical absorption is approximately 50 $cm^{-1}$. However, when the thickness of the AlInN layer is decreased, and the thickness of the AlN layer is increased in an amount corresponding to that of the above decrease so that the total optical thickness of the two layers is maintained to be ¼ wavelength, it is found that the light absorption is decreased.

When the thickness of the AlN layer is 15 nm, and the thickness of the $Al_{0.73}In_{0.27}N$ layer is 29 nm (the combination of the two layers has an optical thickness of ¼ wavelength), the optical absorption is decreased to approximately 20 $cm^{-1}$. By using the above structure, the reflectances are calculated when 20, 30, 40, and 60 pairs are laminated to each other, and the results are shown in FIG. 8.

In the case of the structure shown in the part (2) of FIG. 6, even when 60 pairs are laminated, the reflectance is less than 99.5%; however, in the case of the structure shown in the part (1) of FIG. 6, by using 40 pairs, the reflectance reaches 99.7%. That is, when the structure according to the present invention is used, a low internal loss and a high reflectance, which are believed to be necessary for continuous operation at room temperature, can be simultaneously achieved.

Next, the cumulative strain caused by lattice mismatch will be described. In the case in which the AlInN layer is only used as shown in the part (2) of FIG. 6, when the In composition is adjusted so as to obtain lattice match between this layer and a GaN layer, the strain becomes close to 0, and in addition, the cumulative strain amount (strain×thickness) also becomes close to 0.

In the case in which the AlN layer and the AlInN layer are used as shown in the part (1) of FIG. 6, since the lattice constant of the AlN layer is smaller than that of the GaN layer, a tensile strain is generated inside the AlN layer, and as the thickness thereof is increased, the cumulative strain amount is increased.

In this case, the In composition of the AlInN layer is adjusted to introduce a compression strain therein so as to precisely counteract the tensile strain generated in the AlN layer. The schematic view is shown in FIG. 6. With respect to the direction shown by an arrow 5308, a projection projecting to the left side indicates a compression strain, and a projection projecting to the right side indicates a tensile strain.

As described above, when strain compensation is performed by adjusting the In composition of the AlInN layer, even when a layer containing no In is present, the strain amount can be cumulatively decreased close to 0. Accordingly, introduction of crystalline defects, such as cracks, degrading reflectance and/or yield can be prevented.

In addition, for example, in FIG. 5, doping, electrode formation, and the like, which are necessary for performing current injection, are not shown. However, when appropriate doping, electrode formation, and current constriction structure formation are performed, the structure can be formed in which current injection can be performed.

In addition, in order to decrease a resistance component of the multilayer mirror, between the high refractive-index layer and the low refractive-index layer, a composition gradient layer may also be inserted.

Subsequently, a concrete formation method of a III group nitride semiconductor multilayer mirror having the above structure will be described.

As a growth method, in this example, an organometal chemical vapor deposition method (MOCVD method) is used. However, as long as a high quality nitride semiconductor crystal can be accurately formed, the formation method is not limited to the above MOCVD method, and for example, a molecular beam epitaxial method may also be used.

First, a procedure for growing the lower nitride semiconductor multilayer mirror will be described. As the substrate, a GaN substrate is used. For surface planarization, a GaN buffer layer is first grown by MOCVD. In particular, the substrate temperature is set to 1,050° C., trimethylgallium (TMG) and nitrogen or ammonia are used as a starting material gas, and a hydrogen gas is used as a carrier gas.

After a thickness of approximately 300 to 500 nm is obtained by growth, while ammonia used as a V group starting material is supplied, the supply of TMG used as a III group starting material is stopped so as to stop the growth of GaN, and the hydrogen carrier gas is switched to a nitrogen carrier gas. Accordingly, preparation is made for the growth of the low multilayer mirror.

Subsequently, a procedure for growing the low refractive-index layers will be described. First, after the substrate temperature is decreased to 800° C. and is stabilized, trimethylaluminum (TMAl) and trimethylindium (TMIn), which are starting materials for III group elements, are supplied, so that the growth is started. In this step, in order to obtain a desired In composition and growth rate, the supply amounts of TMAl and TMIn are adjusted.

Figure 9:
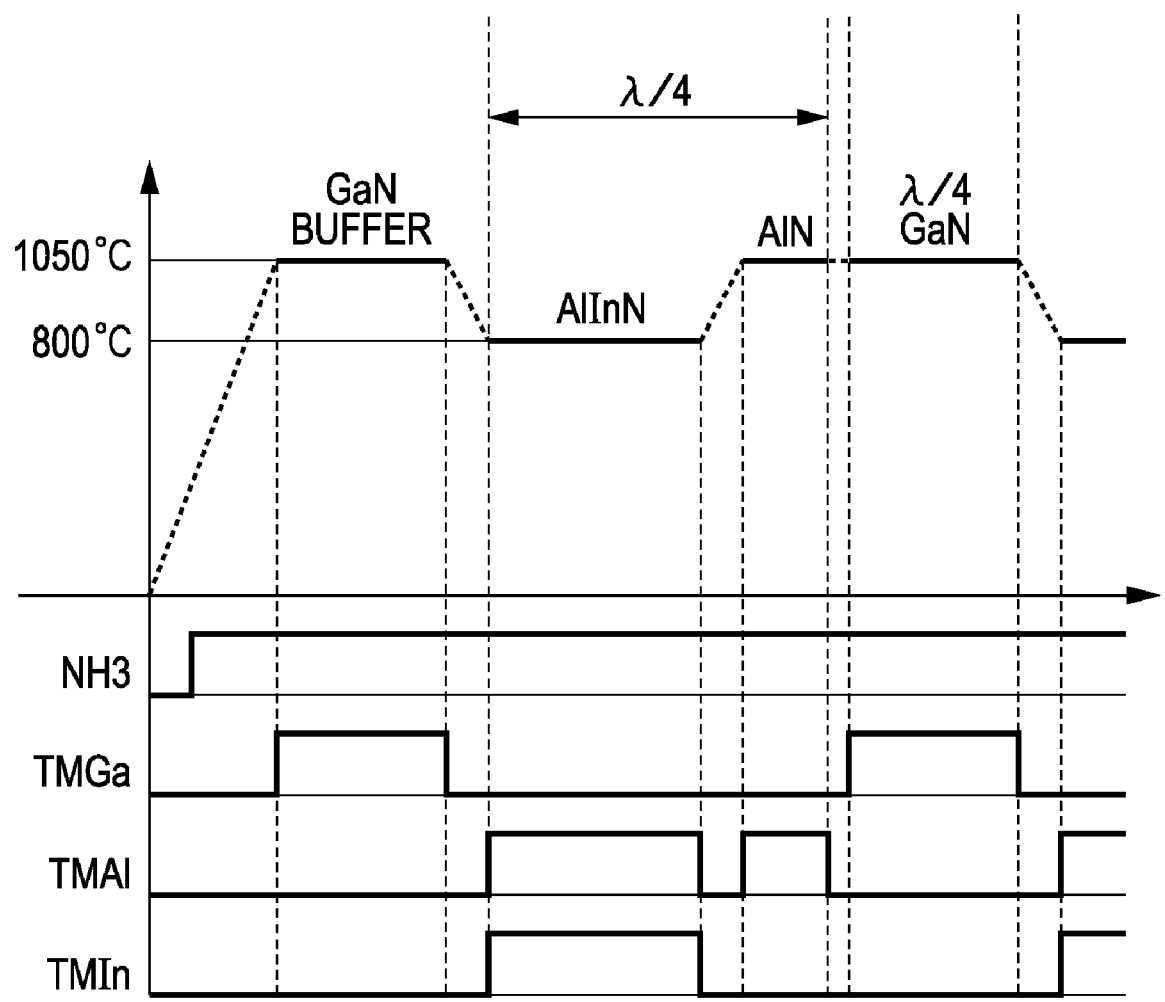
FIG. 9 is a view showing a procedure in which covering is not performed by a layer containing no In when a lower multilayer mirror is formed.

After a thickness of approximately 28 nm is obtained by growth, the supply of TMIn is stopped, and while the same temperature as described above is maintained, the AlN layer is grown to have a thickness of approximately 2 nm. In general, as shown in FIG. 9, when a layer containing In is an outermost layer, and when the temperature thereof is increased, elimination of In occurs from the surface, and due to interface irregularities caused thereby, the reflectance may be decreased in some cases.

Figure 10:
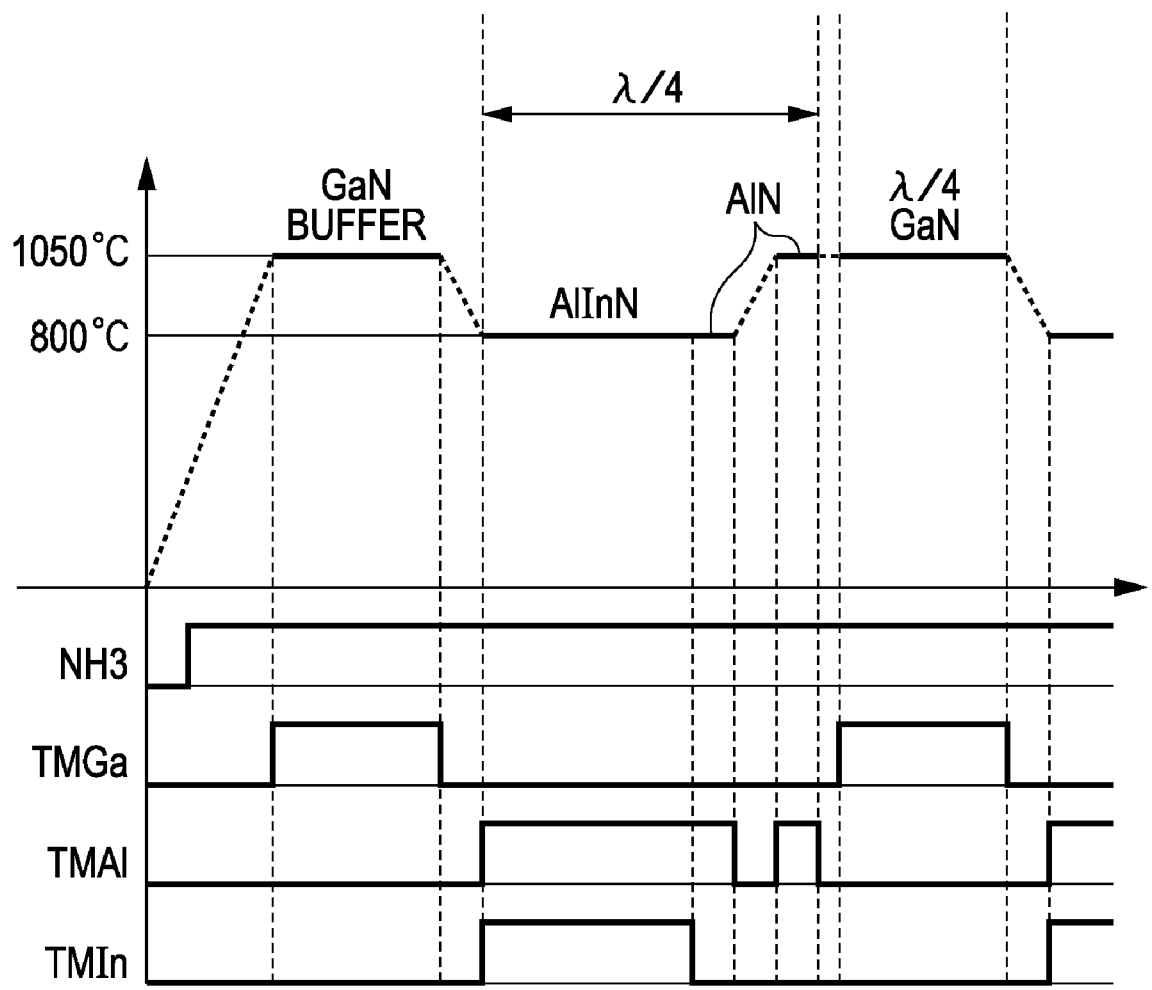
FIG. 10 is a view showing a procedure in which covering is performed by a layer containing no In when a lower multilayer mirror is formed.

Accordingly, as shown in FIG. 10, when an outermost layer having a thickness of approximately 2 nm is covered with a layer containing no In, elimination of In from the surface caused by a subsequent temperature increase is prevented, and the degradation in reflectance caused by the interface irregularities described above can be prevented. After this layer containing no In, which is the AlN layer in this case, is grown to have a thickness of approximately 2 nm, the supply of TMAl is stopped, and the substrate temperature is increased to 1,050° C. After the temperature is stabilized, TMAl is then again supplied, so that an AlN layer is grown to have a thickness of approximately 14 nm. Subsequently, the supply of TMAl is stopped to stop the growth of the AlN layer. By the steps described above, the growth of one low refractive-index layer is completed. Subsequently, at the same temperature as described above, TMGa is supplied so as to grow a GaN layer, which is a high refractive-index layer, to have an optical thickness of ¼ wavelength, and the supply of TMGa is then stopped, so that the growth of GaN is completed. By the steps described above, the growth of one high refractive-index layer is completed. That is, one pair of the low refractive-index layer and the high refractive-index layer is grown. Thereafter, this growth procedure may be repeatedly performed 60 times.

Figure 11:
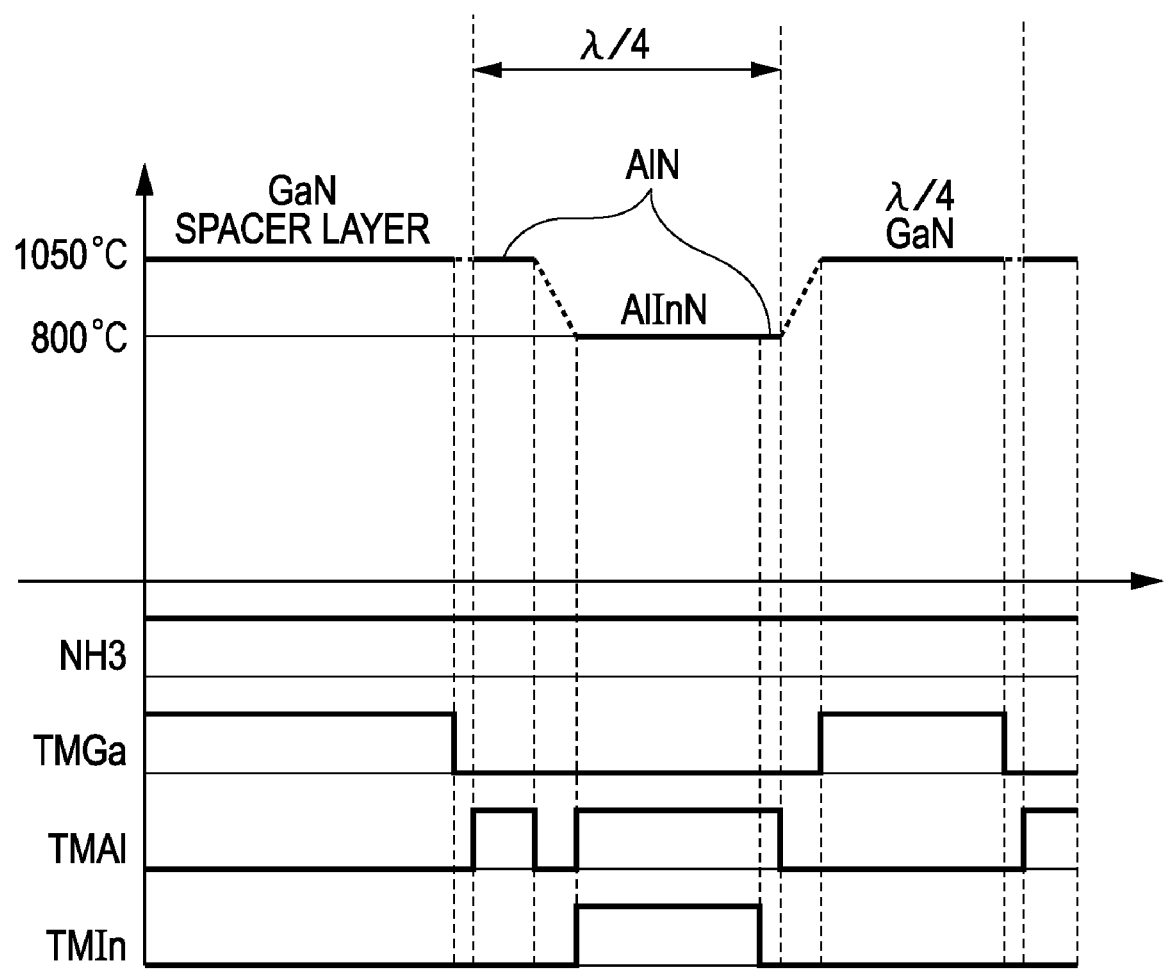
FIG. 11 is a view showing a procedure for forming an upper multilayer mirror.

Next, a procedure for growing the upper nitride semiconductor multilayer mirror will be described with reference to FIG. 11. First, a procedure for growing the low refractive-index layer will be described.

After an InGaN active layer and a GaN spacer layer are formed, the substrate temperature of 1,050° C. and the existence of nitrogen as the carrier gas are confirmed respectively. The supply of TMAl is started to grow an AlN layer to have a thickness of approximately 14 nm, and the supply of TMAl is then stopped to stop the growth. Subsequently, the substrate temperature is decreased to 800° C. After the temperature is stabilized, TMAl and TMIn are supplied to start the growth of an AlInN layer. In this step, the supply amounts of TMAl and TMIn are adjusted so as to obtain a desired Al composition, In composition, and growth rate. After a layer having a thickness of approximately 28 nm is grown, the supply of TMIn is stopped, and at the same temperature as described above, an AlN layer is grown to have a thickness of approximately 2 nm. Accordingly, since a layer containing no In is formed as an outermost layer, elimination of In from the surface caused by a subsequent temperature increase is prevented, and as a result, degradation in reflectance caused by interface irregularities can be prevented. In this case, in order to cover the layer containing In, the AlN layer is formed by stopping the supply of TMIn; however, at the same temperature (800° C.), TMGa may be supplied to grow a GaN layer having a thickness of approximately 2 nm instead of the AlN layer. By the steps described above, the growth of the low refractive-index layer is completed.

Subsequently, a procedure for forming the high refractive-index layer will be described. After it is confirmed that the low refractive-index layer is grown, the layer for preventing desorption of In is present on the uppermost surface, and a nitrogen carrier gas and ammonia are supplied, the substrate temperature is increased to 1,050° C. After the temperature is stabilized, TMGa is supplied, so that the growth of a GaN layer is started. When an optical thickness of ¼ wavelength is obtained, the supply of TMGa is stopped to stop the growth. By the steps described above, the growth of one high refractive-index layer is completed. That is, the growth of one pair layers of the upper multilayer mirror is completed. Hereinafter, this growth procedure may be repeatedly performed 40 times.

Since the growth temperature of a III group nitride semiconductor containing no In, such as GaN or AlGaN, can be set to be sufficiently high, such as 1,000° C. or more, a high quality optical film having small optical absorption can be grown.

On the other hand, when a III group nitride semiconductor layer containing In is grown, in order to prevent the desorption of In during the growth, the growth temperature must be decreased to 700 to 800° C. as described above. As a result, since the crystallinity is degraded, the optical absorption is increased, and when the layer is used for the multilayer mirror, an internal loss at a level that cannot be ignored is generated.

According to this example, the layer containing In and having a high absorption is present in a region having a low light intensity (in the vicinity of the node), and the layer containing no In and having a low absorption is present in a region having a high light intensity (in the vicinity of the antinode). Hence, optical absorption generated in a multilayer mirror having layers containing In can be suppressed, and as a result, a high quality multilayer mirror having a high reflectance and a low optical absorption loss can be obtained.

Since the layer containing no In is present, the layer may not satisfy lattice matching conditions with the substrate. However, in this case, when a strain opposite to that generated in the layer containing no In is intentionally introduced into the layer containing In, the cumulative strain amount of the entire layer structure can be decreased to substantially 0.

As described above, according to this example, a III group nitride semiconductor multilayer mirror can be formed having a low internal loss, a high reflectance, and a small number of cracks, and a high performance surface emitting laser can be realized.

Example 2

Multilayer Mirror Composed of (AlN/AlInN)/(AlGaN/AlGaInN)

In example 2, a surface emitting laser using a multilayer mirror will be described in which a low refractive-index layer and a high refractive-index layer each have a two-layered structure.

Figure 12:
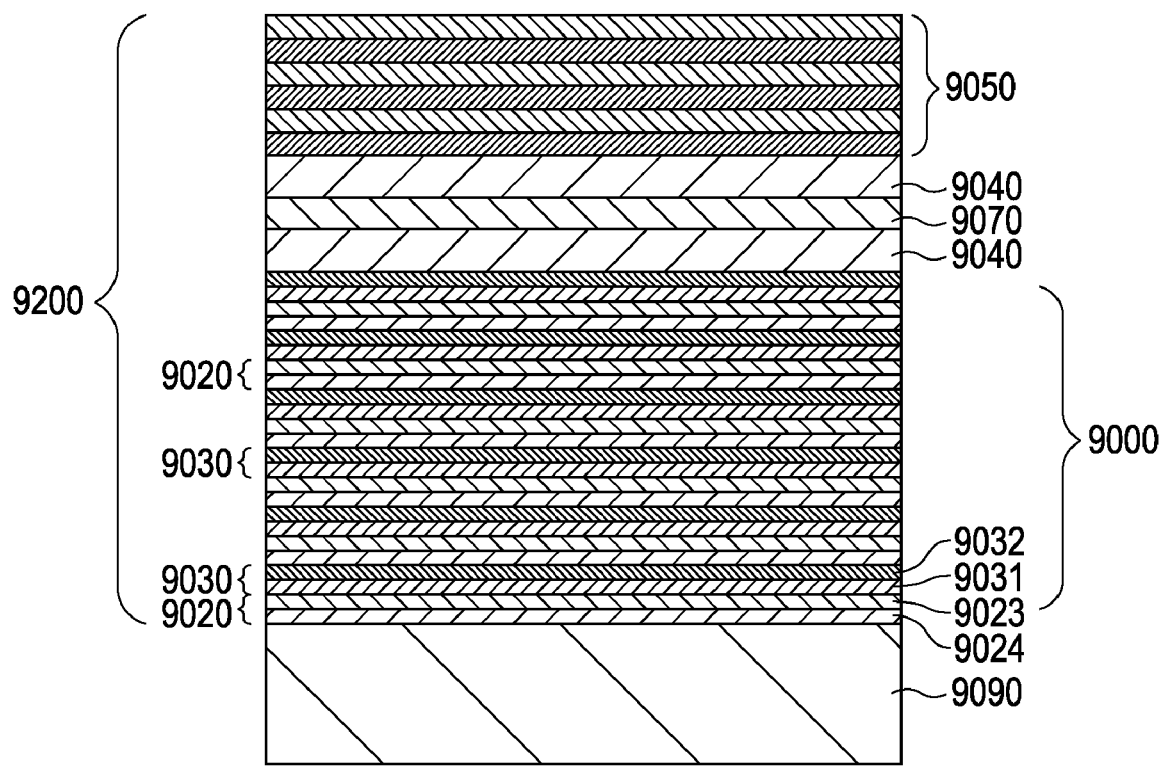
FIG. 12 is a view illustrating a semiconductor laser device according to a second example.

FIG. 12 is a schematic cross-sectional view showing a surface emitting laser illustrating this example. A resonator 9200 of the laser of this example is composed of a quantum well active layer 9070, spacer layers 9040 provided on the top and the bottom thereof, and multilayer mirrors 9000 and 9050 provided on the respective spacer layers. GaN is used for a substrate 9090, (AlN/Al$_{0.73}$In$_{0.27}$N)/(Al$_{0.2}$Ga$_{0.8}$N/Al$_{0.15}$Ga$_{0.8}$In$_{0.05}$N) are used for the multilayer mirror 9000, a GaN quantum well is used for the quantum well active layer 9070, and SiO$_2$/TiO$_2$ are used for the multilayer mirror 9050.

The GaN quantum well active layer 9070 used in this example includes, for example, four GaN well layers, and the central emission light wavelength is 350 nm. In addition, as the spacer layer 9040, AlGaN is used. In particular, Al$_{0.1}$Ga$_{0.9}$N is used so that light emitted from the GaN quantum well active layer 9070 is not absorbed. In addition, whenever necessary, the emission light wavelength, the number of wells, and/or the spacer layer can be adjusted.

The multilayer mirror 9000 is composed of low refractive-index layers 9030 each formed in combination of AlN 9032 and Al$_{0.73}$In$_{0.27}$N 9031 and high refractive-index layers 9020 each formed in combination of Al$_{0.2}$Ga$_{0.8}$N 9024 and Al$_{0.15}$Ga$_{0.8}$In$_{0.05}$N 9023.

Also in this example, the Al composition and the In composition of each layer are determined so that light emitted from the active layer is not absorbed. The low refractive-index layer 9030 and the high refractive-index layer 9020 each have an optical thickness of ¼ wavelength. In addition, the thickness ratio of the AlN 9032 to the Al$_{0.73}$In$_{0.27}$N 9031 and that of the Al$_{0.2}$Ga$_{0.8}$N 9024 to the Al$_{0.15}$Ga$_{0.8}$In$_{0.05}$N 9023 are each set to 1 to 2.

A great number of pairs each containing the low refractive-index layer and the high refractive-index layer are laminated to each other, so that the multilayer mirror functions. In addition, the upper dielectric multilayer mirror is deposited by electron beam deposition or the like.

Figure 13:
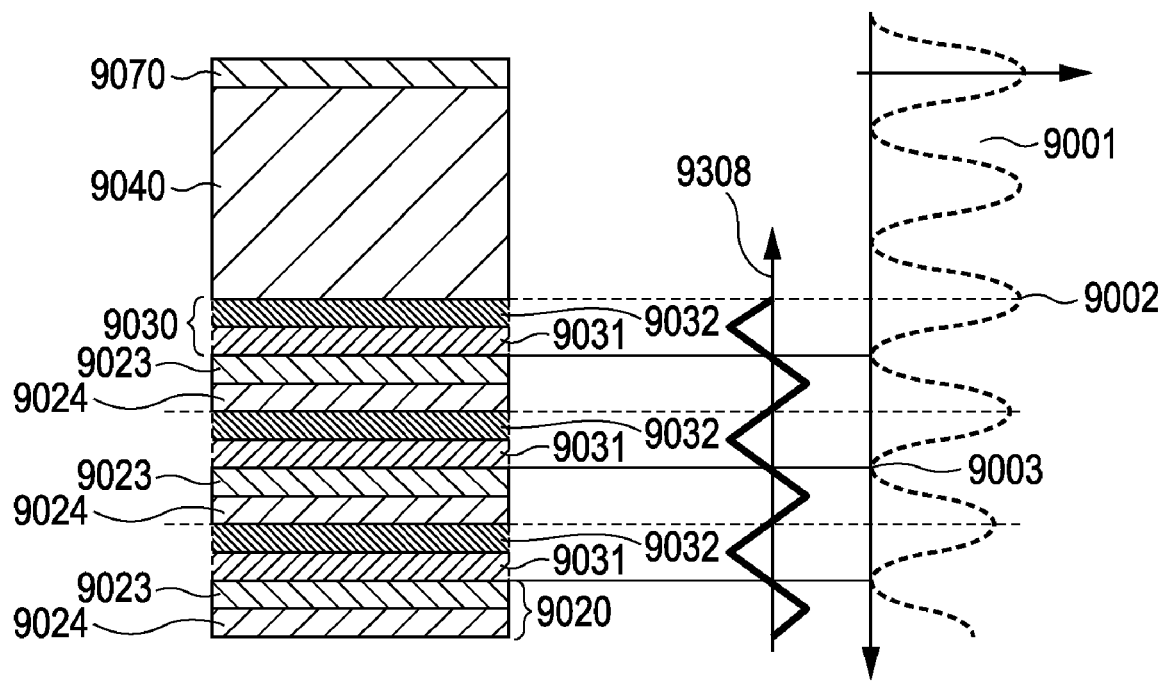
FIG. 13 is a view showing a resonator structure, internal light intensity distribution, and cumulative strain amount.
Figure 14:
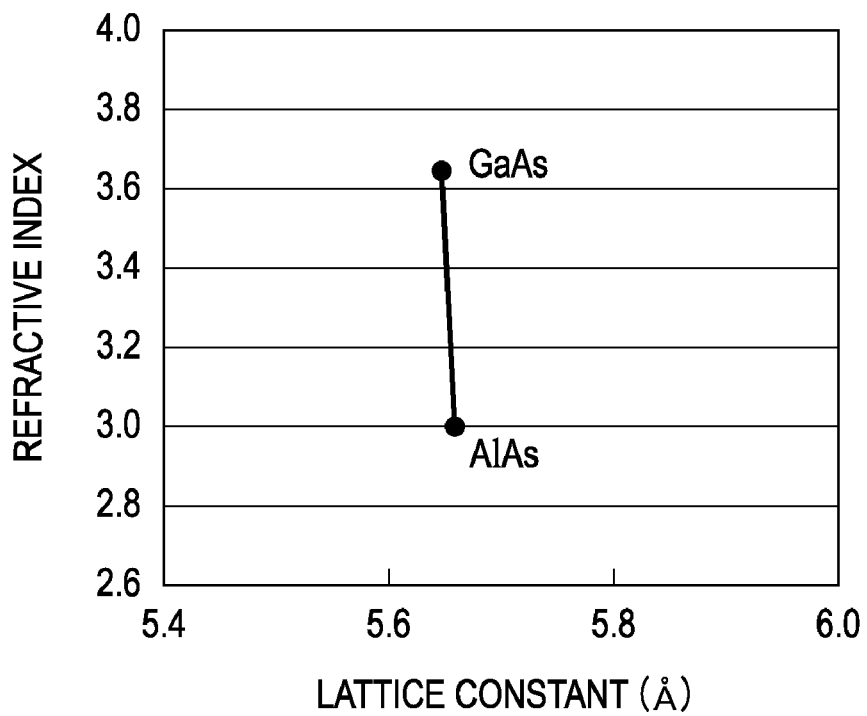
FIG. 14 is a view showing the lattice constant and the refractive index of a material forming a multilayer mirror used in a GaAs-based semiconductor laser.
Figure 15:
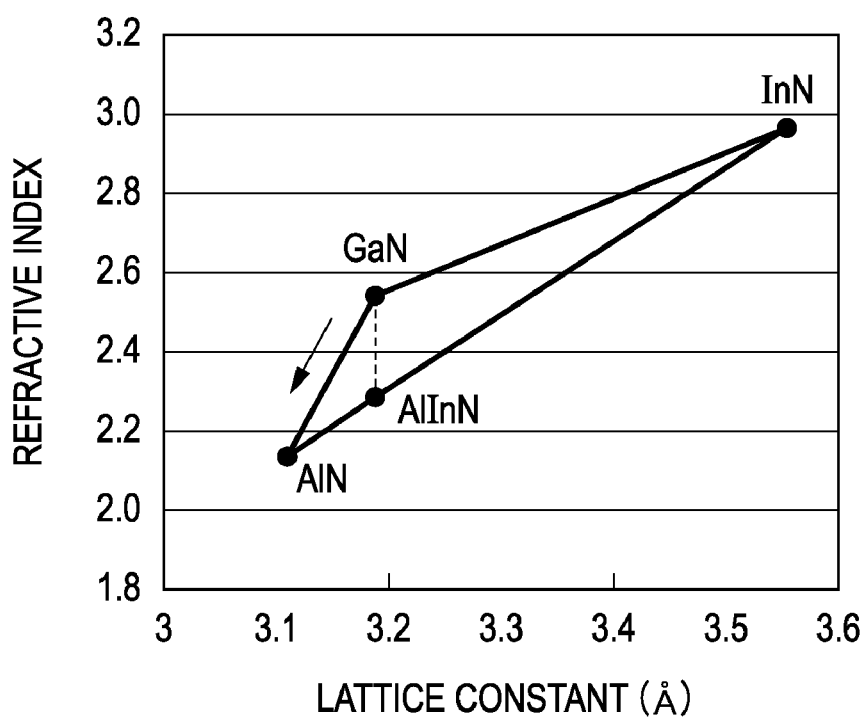
FIG. 15 is a view showing the lattice constant and the refractive index of a material composition forming a multilayer mirror used in a GaN-based semiconductor laser.

Subsequently, the structure of this nitride multilayer mirror will be described. FIG. 13 is an enlarged view of the resonator containing the (AlN/Al$_{0.73}$In$_{0.27}$N)/(Al$_{0.2}$Ga$_{0.8}$N/Al$_{0.15}$Ga$_{0.8}$In$_{0.5}$N) multilayer mirror 9000 and the GaN quantum well active layer 9070, which are shown in FIG. 12.

In order to facilitate the understanding of the figure, the lower multilayer mirror 9000 is shown in which the active layer 9070, the spacer layer 9040, and three pairs each containing the lower and the high refractive-index layers are only laminated to each other. In addition, at the right side of the figure, the internal light intensity distribution is also shown.

As shown in FIG. 13, in the low refractive-index layer 9030, the layer (AlN layer) containing no In is disposed at the antinode side (9002) of the light intensity distribution 9001, and the layer ($Al_{0.73}In_{0.27}N$ layer) containing In is disposed at the node side (9003). In addition, in the same manner as described above, in the high refractive-index layer 9020, the layer ($Al_{0.2}Ga_{0.8}N$ layer) containing no In is disposed at the antinode side (9002) of the light intensity distribution, and the layer ($Al_{0.15}Ga_{0.8}In_{0.05}N$ layer) containing In is disposed at the node side (9003). That is, in the low refractive-index layer 9030, at the side close to the active layer 9070, the layer 9032 containing no In is disposed, and at the side apart from the active layer 9070, the layer 9031 containing In is disposed. On the other hand, in the high refractive-index layer 9020, at the side close to the active layer 9070, the layer 9023 containing In is disposed, and at the side apart from the active layer 9070, the layer 9024 containing no In is disposed. That is, light absorption generated in the layer containing In can be effectively suppressed.

Next, the cumulative strain caused by lattice mismatch will be described. As shown by an arrow 9308 in FIG. 13, in the AlN layer 9032 and the $Al_{0.73}In_{0.27}N$ layer 9031 of the low refractive-index layer 9030, since the AlN layer has a lattice constant smaller than that of a GaN layer, a tensile strain is generated in the AlN layer, and as the thickness thereof is increased, the cumulative strain amount is increased. Accordingly, by adjusting the In composition of the AlInN layer, a compression strain is introduced in the AlInN layer so as to precisely counteract the tensile strain generated in the AlN layer. In this case, the thickness ratio of the AlN layer to the $Al_{0.73}In_{0.27}N$ layer is set to 1 to 2.

On the other hand, in the $Al_{0.2}Ga_{0.8}N$ layer 9024 and $Al_{0.15}Ga_{0.8}In_{0.05}N$ layer 9023 of the high refractive-index layer 9020, since the $Al_{0.2}Ga_{0.8}N$ layer has a lattice constant smaller than that of a GaN layer, a tensile strain is generated in the $Al_{0.2}Ga_{0.8}N$ layer, and as the thickness thereof is increased, the cumulative strain amount is increased. Accordingly, by adjusting the In composition of the AlGaInN layer, a compression strain is introduced in the AlGaInN layer so as to precisely counteract the tensile strain generated in the $Al_{0.2}Ga_{0.8}N$ layer.

In this case, the thickness ratio of the AlGaN layer to the AlGaInN layer is set to 1 to 2. As has thus been described, in both the low refractive-index layer and the high refractive-index layer, the cumulative strain amount can be decreased to substantially 0.

In FIG. 13, since doping, electrode formation, and the like, which are necessary for current injection, have no direct relation to the present invention, they are omitted. However, when appropriate doping, electrode formation, and current constriction structure formation are performed, the structure can be formed in which current injection can be performed. In addition, in order to decrease a resistance component of the multilayer mirror, a composition gradient layer may also be inserted between the low refractive-index layer and the high refractive-index layer.

Accordingly, in this example, a III group nitride semiconductor multilayer mirror having a low internal loss, a high reflectance, and a small number of cracks can be formed, and as a result, a high performance surface emitting laser can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Application No. 2006-237591 filed Sep. 1, 2006, which is hereby incorporated by reference herein in its entirety.

What is claimed is:

1. A semiconductor laser device comprising:
   two mirrors disposed to face each other in order to form a cavity; and
   an active layer disposed between the two mirrors,
   wherein at least one of the two mirrors is a multilayer mirror including at least one first nitride semiconductor layer containing Ga and at least one second nitride semiconductor layer containing Al, which are alternately laminated to each other,
   wherein the second nitride semiconductor layer includes:
      a first region containing In and having a refractive index lower than that of the first nitride semiconductor layer; and
      a second region having a refractive index lower than that of the first nitride semiconductor layer and having an In concentration lower than that of the first region, and
   wherein the second region is disposed at a position closer to the active layer than a position at which the first region is disposed.

2. The semiconductor laser device according to claim 1, wherein the second region contains no In.

3. The semiconductor laser device according to claim 2, wherein the first region forming the second nitride semiconductor layer includes aluminum indium nitride, and the second region includes aluminum nitride.

4. The semiconductor laser device according to claim 1, wherein the first nitride semiconductor layer containing Ga includes gallium nitride.

5. The semiconductor laser device according to claim 1, wherein an In concentration of at least one of the first region and the second region has a gradient in a lamination direction of the multilayer mirror.

6. The semiconductor laser device according to claim 1, wherein the first region has a compressive strain, and the second region has a tensile strain.

7. A semiconductor laser device comprising:
   two mirrors disposed to face each other in order to form a cavity; and
   an active layer disposed between the two mirrors, wherein at least one of the two mirrors is a multilayer mirror including at least one first nitride semiconductor layer containing Ga and at least one second nitride semiconductor layer containing Al, which are alternately laminated to each other,
   the second nitride semiconductor layer has a refractive index lower than that of the first nitride semiconductor layer, and,
   when the second nitride semiconductor layer is equally divided with respect to an optical film thickness into two portions, an In concentration of a first portion close to the active layer is lower than that of a second portion apart from the active layer.

8. A semiconductor laser device comprising:
   two mirrors disposed to face each other in order to form a cavity; and
   an active layer disposed between the two mirrors,
   wherein at least one of the two mirrors is a multilayer mirror including at least one first nitride semiconductor layer containing Ga and at least one second nitride semiconductor layer containing Al, which are alternately laminated to each other,
   wherein the first nitride semiconductor layer includes:

a first region containing In and having a refractive index higher than that of the second nitride semiconductor layer; and a second region having a refractive index higher than that of the second nitride semiconductor layer and having an In concentration lower than that of the first region, and wherein the first region is disposed at a position closer to the active layer than a position at which the second region is disposed.

9. The semiconductor laser device according to claim 8, wherein the second region contains no In.

10. The semiconductor laser device according to claim 9, wherein the first region includes aluminum gallium indium nitride, and the second region includes aluminum gallium nitride.

11. The semiconductor laser device according to claim 8, wherein an In concentration of at least one of the first region and the second region has a gradient in a lamination direction of the multilayer mirror.

12. The semiconductor laser device according to claim 8, wherein the first region has a compression strain, and the second region has a tensile strain.

13. A semiconductor laser device comprising:

two mirrors disposed to face each other in order to form a resonator; and an active layer disposed between the two mirrors, wherein at least one of the two mirrors is a multilayer mirror including at least one first nitride semiconductor layer containing Ga and at least one second nitride semiconductor layer containing Al, which are alternately laminated to each other, the first nitride semiconductor layer has a refractive index higher than that of the second nitride semiconductor layer, and, when the first nitride semiconductor layer is equally divided with respect to an optical film thickness into two portions, an In concentration of a first portion close to the active layer is higher than that of a second portion apart from the active layer.

* * * * *